(12) United States Patent
Meyer et al.

(10) Patent No.: US 7,716,823 B2
(45) Date of Patent: May 18, 2010

(54) BONDING AN INTERCONNECT TO A CIRCUIT DEVICE AND RELATED DEVICES

(75) Inventors: Neal Meyer, Corvallis, OR (US); Ronald Hellekson, Eugene, OR (US); Ronnie Yenchik, Blodgett, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1408 days.

(21) Appl. No.: 10/822,064

(22) Filed: Apr. 8, 2004

(65) Prior Publication Data

US 2005/0223552 A1     Oct. 13, 2005

(51) Int. Cl.
H05K 3/30     (2006.01)
(52) U.S. Cl. .............................. 29/834; 29/832; 29/830; 257/723; 257/737; 257/778; 438/108; 438/118
(58) Field of Classification Search ................... 29/832, 29/834; 257/737, 738, 778, 723; 438/108, 438/115, 118, 666
See application file for complete search history.

(56) References Cited

U.S. PATENT DOCUMENTS

| | | | |
|---|---|---|---|
| 5,233,134 | A | 8/1993 | Hirai |
| 5,985,084 | A | 11/1999 | Summersgill et al. |
| 6,054,371 | A | 4/2000 | Tsuchiaki |
| 6,284,072 | B1 | 9/2001 | Ryan et al. |
| 6,341,190 | B1 | 1/2002 | Sumersgill et al. |
| 6,348,999 | B1 | 2/2002 | Summersgill et al. |
| 6,517,995 | B1 | 2/2003 | Jacobson et al. |
| 6,555,908 | B1 * | 4/2003 | Eichelberger et al. ........ 257/737 |
| 6,936,928 | B2 * | 8/2005 | Hedler et al. ................ 257/778 |
| 6,962,835 | B2 * | 11/2005 | Tong et al. ................... 438/108 |
| 2003/0016503 | A1 | 1/2003 | Frankowsky |
| 2003/0042587 | A1 | 3/2003 | Lee |

FOREIGN PATENT DOCUMENTS

| | | |
|---|---|---|
| WO | WO9635971 | 11/1996 |
| WO | WO98/21626 | 5/1998 |
| WO | WO01/11591 | 2/2001 |

OTHER PUBLICATIONS

Marked-Up A & C Above.*
Shigetou, "Room temperature direct bonding of CMP-Cu film for bumpless interconnection", Electronic Components & Tech Conf, May 29, 2001, pp. 755-760.
Suga, "Bump-less interconnect for next generation system packaging", Electronic Components & Tech Conf, May 29, 2001, pp. 1003-1008.
Suga, "Surface activated bonding for new flip chip and bumpless interconnect systems", Electronic Components & Tech Conf, May 29, 2001, pp. 105-111.
"High-resolution soft lithography"; IBM Zurich Research Laboratory, Science & Technology, Microcontact processing; http://www.zurich.ibm.com/st/microcontact/highres/.
"Replica Molding (REM)"; Lithotemplate.html.; http://www.ee.washingtn.edu/research/microtech/cam/CAMreplicamolding.html.

(Continued)

Primary Examiner—Rick K Chang

(57) ABSTRACT

This disclosure relates to a system and method for bonding an interconnect to a dense circuit device with a mechanically clamping substrate.

52 Claims, 17 Drawing Sheets

OTHER PUBLICATIONS

Schwartz; "Numerical modeling of liquid withdrawal from gravure cavities in coating operations; the effect of cell pattern"; Journal of Engineering Mathematics 42: 243-253,2002.

"Coating Techniques"; Coating Techinques—Gravure Coating; http://www.ferron-magnetic.co.uk/coatings/gravure.htm.

Tan, et al; "Roller nanoimprint lithography"; J. VAc. Sci. Technol. B 16(6), Nov./Dec. 1998; pp. 3926-3928.

"The Yasui Seiki "Micro Gravure" Coating Method"; www.yasui.com; pp. 1-10.

Stix; "Breaking the Mold";http://www.sciam.com/print_version.cfm?articlID= 0000AAB9-BAF8-1D07-8E49809EC5...; 2pages.

"Continuous coating pilot plant"; ichemco; http://www.ichemco.it/eng/pilot.htm.; 4 pages.

"Norland Optical Adhesive 83H"; http://www.gentec.be/noa83h.htm.; 2 pages.

"Norland Optical Adhesive 83H"I http;//www.norlandprod.com/adhesives/noa83h.html.; 2 pages.

Shepherd; "Modern coating technology systems, for paper, film and foil"; Frank Shepherd 1995; ISBN 0 902098. 6 pages.

Michel, et al; "Printing meets lithography: Soft approaches to high-resolution patterning"; IBM J. Res. & Dev. vol. 45, No. 5; Sep. 2001; pp. 697-719.

Lee, et al; "Design and Fabrication of CD-Like Microfluidic Platforms for Diagnostics: Polymer-Based Microfabrication"; Biomedical Microdevices 3:4, 339-351, 2001; pp. 339-351.

Ma, et al.; "Low Temperature Bonding for Wafer Scale Packaging and Assembly of Micromachined Sensors"; 1998-1999; 3 pages.

Gillmor, et al.; "Low-Contact-Angle Polydimethyl Siloxane (PDMS) Membranes for Fabricating Micro-Bioarrays"; Now at Biology and Biomedical Sciences, Yale University. 6 pages.

Efimenko, et al; "Surface Modificatin of Sylgard-184 Poly (dimethyl siloxane) Networks by Ultraviolet and Ultraviolet/Ozone Treatment"; Journal of Colloid and Interface Science 254, 306-315 (2002) doi: 10.1006/jcis.2002.8594. pp. 306-315.

"Micro-Contact Printing (uCP)"; Lithotemplate.html; http://www.ee.washington.edu/research/microtech/cam/CAM-microcontactprinting.html; 2 pages.

"High-resolution microcontact printing of SAMs"; IBM Zurich Research Laboratory, Science & Technology, Microcontact processing; http://www.zurich.ibm.com/st/microcontact/highres/mucp.html.; 2 pages.

Whitesides; "Soft Lighography"; http://www.wtec.org/loyola/nano/US.Review/04_02.html.; 4 pages.

Stix; "Soft Manufacturing; Shaping small structures in ruber has moved beyond a Harvard lab"; Scientific Amnerican.com; 2 pages.

"Teflon AF: A new Generation of High-Performance Fluoropolymer Resins"; http://www.dupont.com/teflon/af/. 1 page.

Silicone-based Adhesives; Industrial and Electronics Products; www.adhesiversresearch.com/catalog/indsil.htm.

* cited by examiner

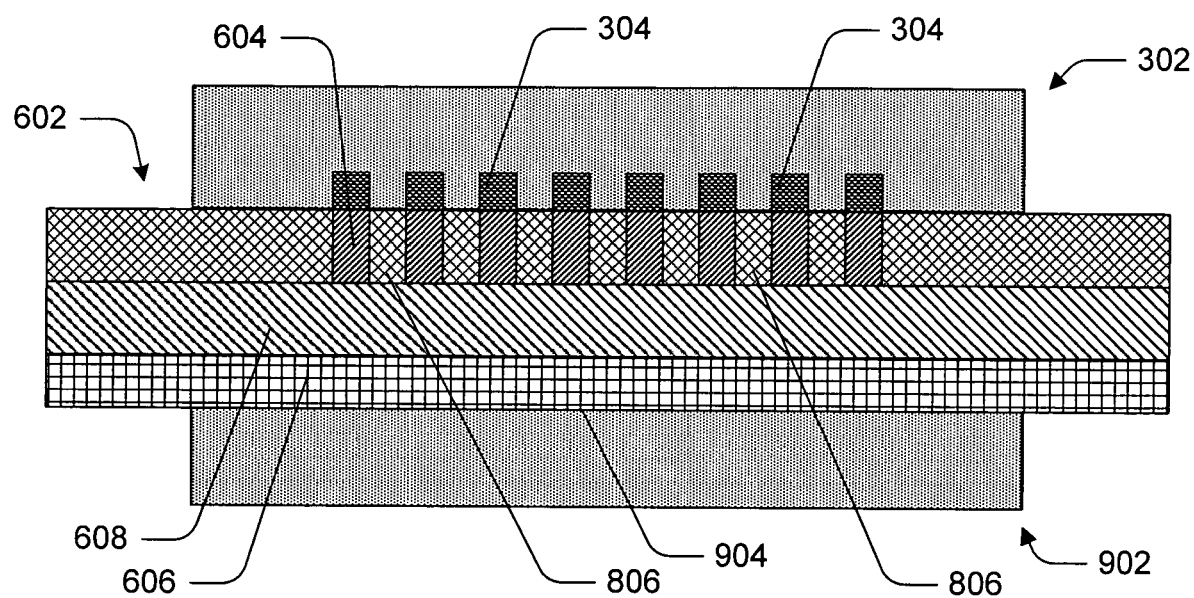
Fig. 11
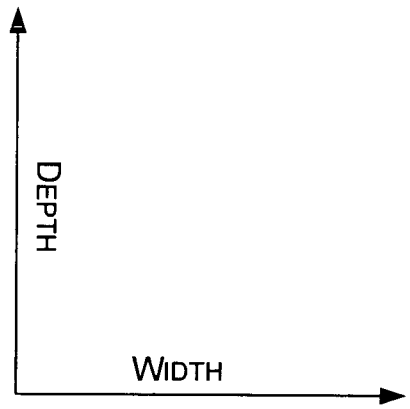

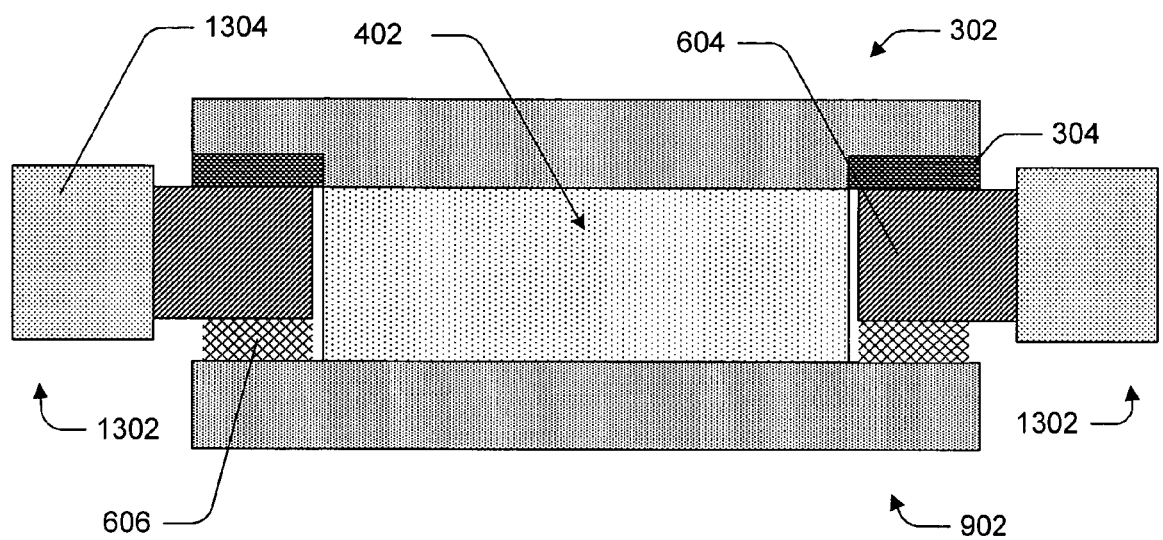
Fig. 13
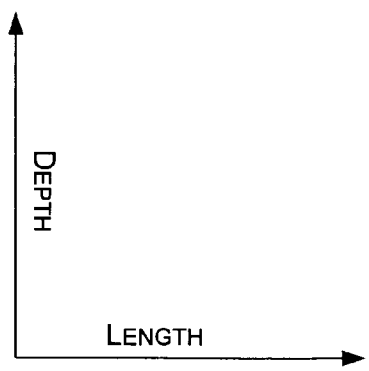

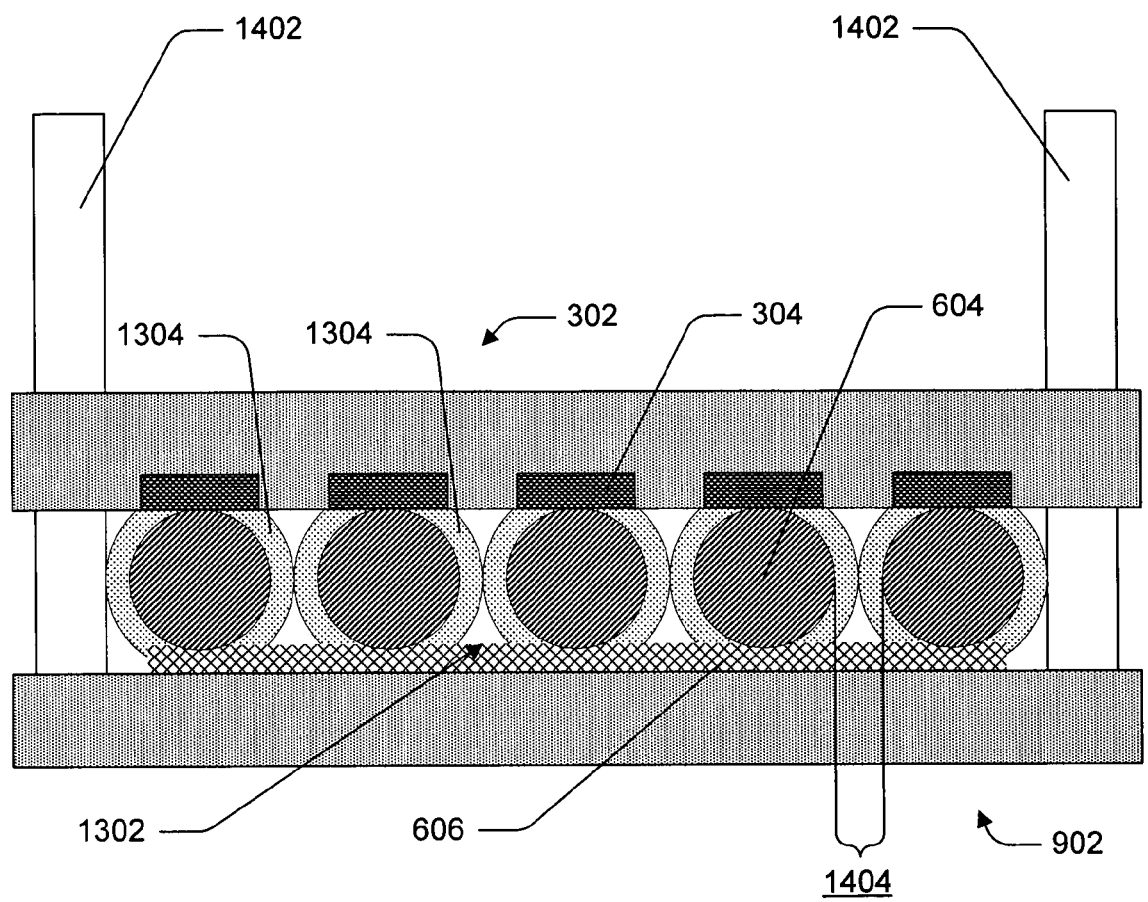
Fig. 14
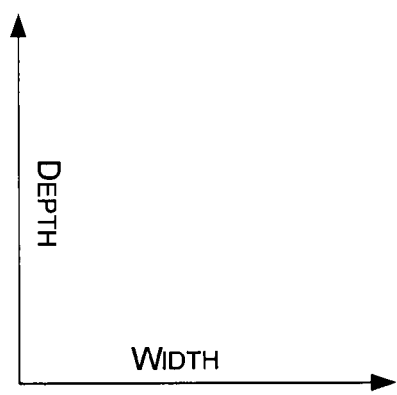

BONDING AN INTERCONNECT TO A CIRCUIT DEVICE AND RELATED DEVICES

TECHNICAL FIELD

This invention relates to bonding of interconnects to circuit devices.

BACKGROUND

A circuit device typically communicates electrically through "interconnects." Interconnects are so named because they allow circuit devices to electrically connect with other circuit elements. Interconnects often include an arrangement of conductive wires to electrically connect a circuit device. Use of circuit devices that are small or densely packed ("dense circuit devices"), however, can be limited because of difficulties in bonding interconnects to such devices.

By way of example and referring to FIG. 1, a side-section view of a fragment of a dense circuit device is indicated generally by reference numeral 102. The device 102 includes electrical bond pads 104. The pads 104 have a width 106 and are generally separated from each other by a space 108. The smaller or denser the device 102, typically the less the width 106 and the space 108. As the width 106 and space 108 of the pads 104 get smaller and smaller with production of smaller or denser circuit devices, forming interconnections among and between these devices becomes more and more difficult.

Again referring to FIG. 1, a side-section view of a fragment of a conventional interconnect is indicated generally by reference numeral 110. The conventional interconnect 110 is typically made of different materials than the device 102, often because the materials used in the device 102 are relatively expensive. Also typically, to bond the conventional interconnect 110 to the pads 104 of the device 102, heat is used.

But a significant problem can occur when using heat to bond the conventional interconnect 110 to the pads 104 of the device 102. If the coefficient of thermal expansion (called "CTE") for the conventional interconnect 110 and the device 102 are even slightly different, wires 112 of the conventional interconnect 110 may not match up with the pads 104 when they are heated for bonding. When the width 106 or the space 108 is very small, the wires 112 may completely miss the pads 104 or line up with the wrong ones.

By way of example and referring to FIG. 2, a side sectional view of the device 102 and the conventional interconnect 110 when each is heated is shown. Both the device 102 and the conventional interconnect 110 are shown expanded in this example, but the expansion of the conventional interconnect 110 does not match the expansion of the device 102. As shown, the wires 112 do not properly match up with the pads 104. When the width 106 or the space 108 is very small, such as less than 100 nanometers, and the device 102 or the interconnect 110 is significantly larger than the width 106 or the space 108, a difference in coefficient of thermal expansion between the device 102 and the conventional interconnect 110 may cause the pads 104 and the wires 112 to not match up with each other. If, for instance, a coefficient of thermal expansion between the device 102 and the interconnect 110 is different by five percent, the wires 112 and the pads 104 may miss each other by hundreds and hundreds of nanometers. This failure of conventional heat bonding may make it impractical or unusable for interconnecting to some dense circuit devices.

Other prior-art techniques for bonding an interconnect to a circuit device can also cause various problems. Eutectic bonding, for instance, can require use of specific, non-optimal materials for the wires 112 and/or the bond pads 104. These non-optimal materials can limit the usability of the dense circuit device 102, because they may not be highly conductive, which is especially important with small-scale interconnects used with dense circuit devices. This eutectic bonding technique can also fail by providing too weak an electrical connection between the bond pads 104 and the wires 112.

Further, these and other typical techniques for electrically bonding the conventional interconnect 110 to the circuit device 102 include mechanical bonding of the wires 112 to the bond pads 104. This can cause a significant problem. If the device 102 and the conventional interconnect 110 are subject to heat, CTE mismatch of the wires 112 to the bond pads 104 can cause the mechanical bonding between them to fail. This mechanical failure often causes the electrical connection between the wires 112 and the bond pads 104 to also fail.

There is, therefore, a need for a technique for bonding interconnects to dense circuit devices that reduces CTE-related problems, and is reliable, less expensive, and/or more production-friendly than permitted by present-day techniques.

BRIEF DESCRIPTION OF THE DRAWINGS

FIG. 11 is a side-section view along a depth and width dimension of the FIG. 10 dense circuit device, spacer substrate, bottom substrate, and electrical interconnect.

FIG. 13 is a view of the FIG. 5 dense circuit device and spacer substrate and an embodiment of a grouped-wire interconnect and the FIG. 9 bottom substrate.

FIG. 14 is a side-section view along a depth and width dimension of the FIG. 13 dense circuit device, grouped-wire interconnect, and bottom substrate.

The same numbers are used throughout the disclosure and figures to reference like components and features.

DETAILED DESCRIPTION

The following disclosure describes various interconnects and methods for bonding them to a dense circuit device. In at least some embodiments, these interconnects and bonding methods enable electrical connection with a large, ultra-dense circuit device that allows for high conductivity and accurate pad-wire matching while also being relatively reliable, inexpensive, and production-friendly. In at least one embodiment, these interconnects and bonding methods enable low- or room-temperature bonding with a dense circuit device.

In at least some embodiments, the disclosed interconnects and bonding methods allow for interconnecting multiple dense circuit devices. Two dense circuit devices, for instance, can be bonded to one interconnect.

As used herein, the term "bonding" comprises mechanically and/or electrically connecting one structure to another. A mechanical bond, for instance, can comprise a covalent bond between a surface of one structure and a surface of another. An electrical bond is one that provides sufficient proximity to permit electrical communication. Mechanical and electrical bonds can coexist, though that is not necessary.

Figure 1:
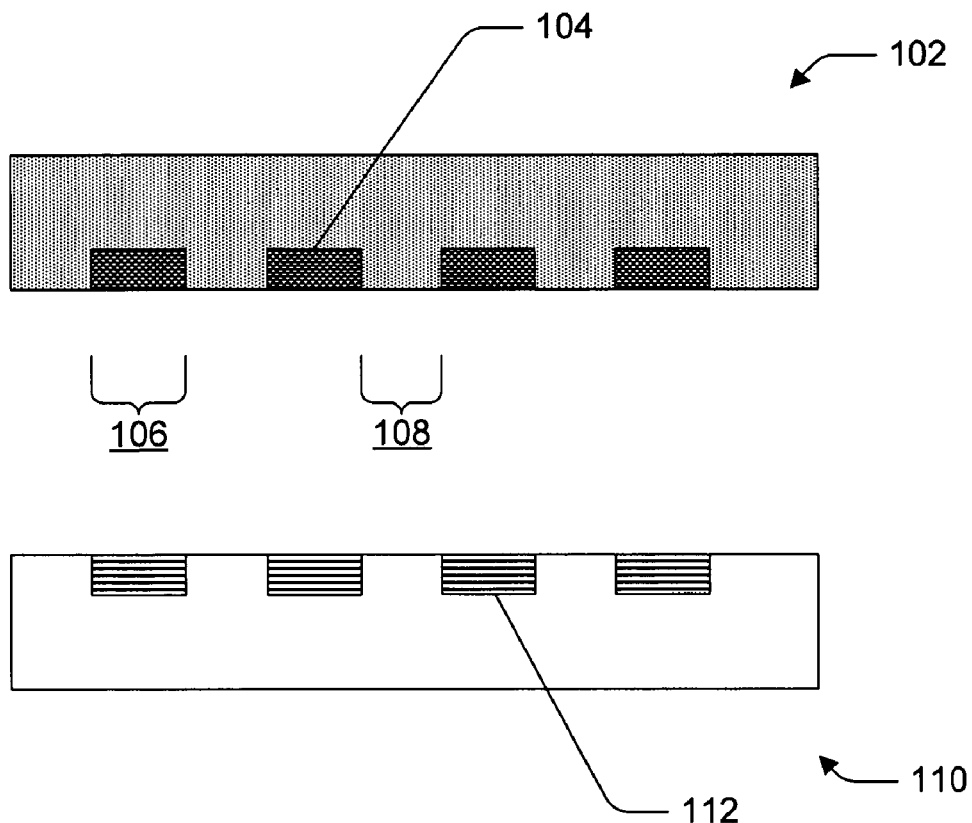
FIG. 1 is a side-section view along a depth and width dimension of a prior-art dense circuit device and prior-art interconnect, and is discussed in the "Background" section above.
Figure 1:
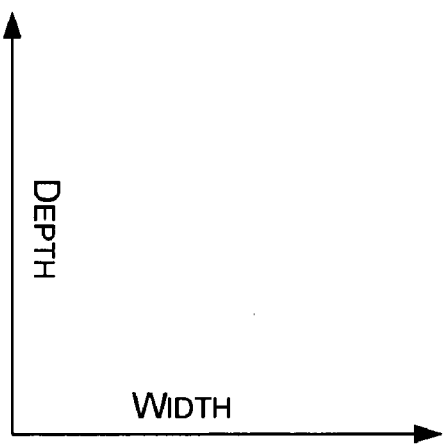
Figure 2:
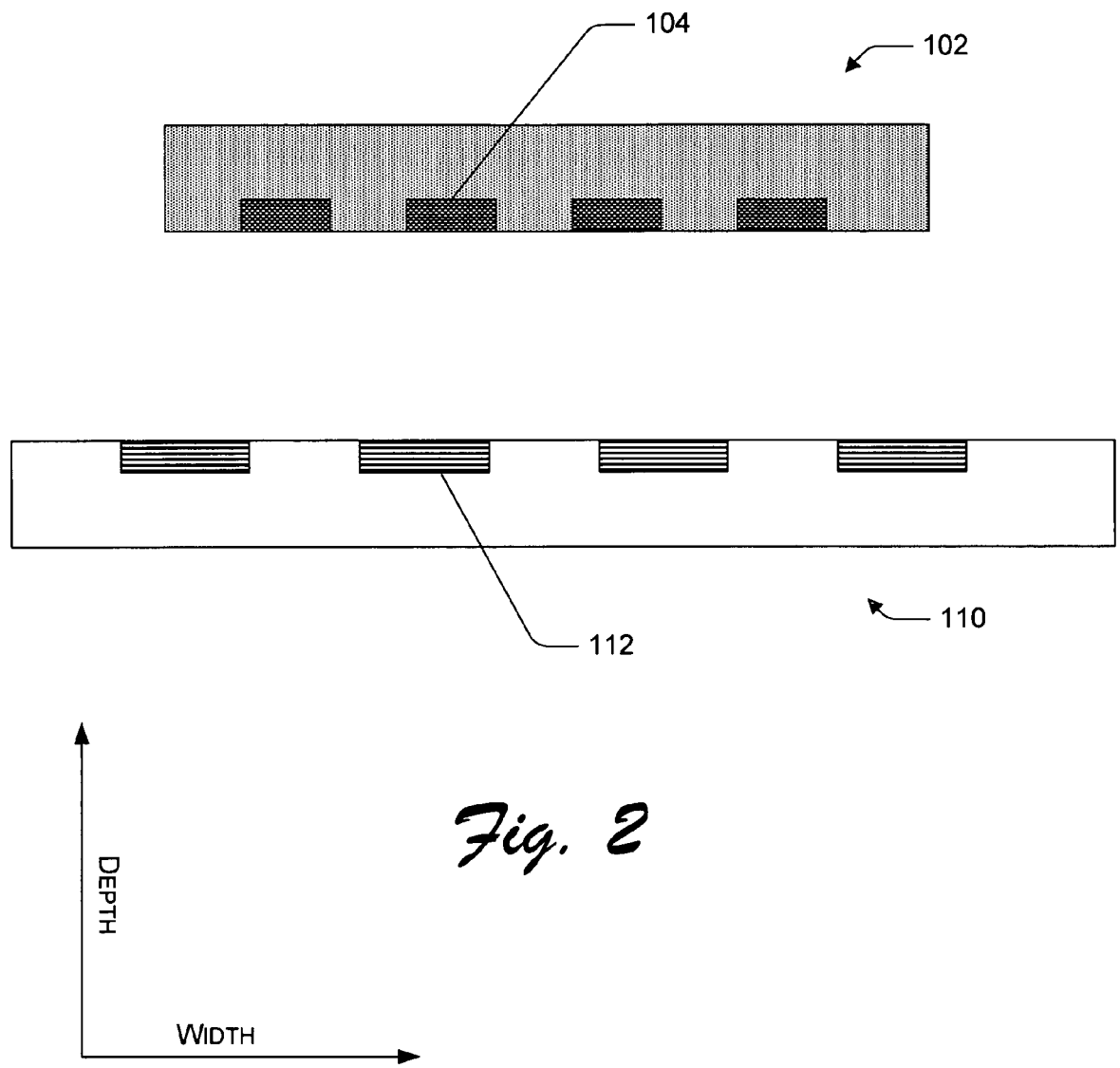
FIG. 2 is a view of the dense circuit device and the interconnect of FIG. 1 after each is heated.
Figure 3:
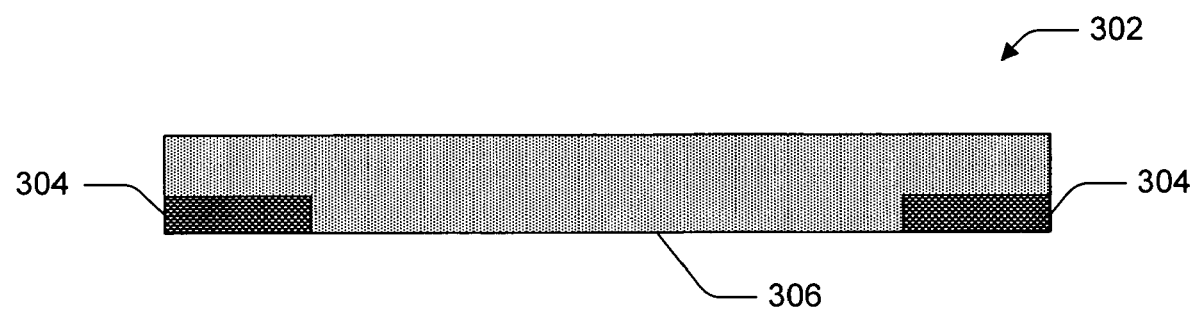
FIG. 3 is a side-section view along a depth and length dimension of one embodiment of a dense circuit device with electrical bond pads.
Figure 3:
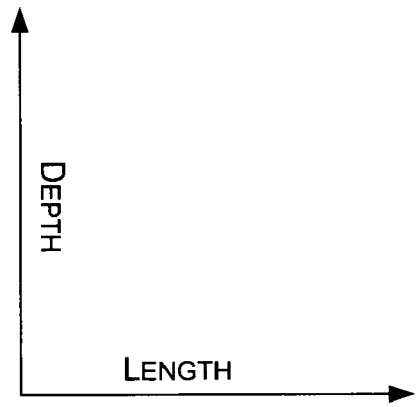

Referring initially to FIG. 3, a side-section view along a depth and length dimension of a circuit device 302 is shown. The circuit device 302 comprises electrical bond pads 304 formed on outside edges of the device 302.

The device 302 and its bond pads 304 can comprise various types of materials. The device 302 can comprise silicon and other circuitry materials, for instance. For example, the bond pads 304 can comprise various conductors, such as gold, copper, palladium, platinum, and aluminum.

The device 302 and its bond pads 304 can be of various sizes, although it is to be appreciated that the Figure constitutes a diagrammatic view which is not to scale. In the ongoing example, the device 302 is square, with a length and width of about ten millimeters. The device 302 can also be from less than or about one to about twenty-five millimeters in length or width. Also in the ongoing example, the bond pads 304 are about 100 nanometers deep, 30 nanometers wide, and 100 nanometers long.

In one embodiment, a lower device surface 306 of the device 302 is prepared for bonding. The lower device surface 306 can be prepared for bonding using various techniques, such as mechanical abrading techniques like chemical-mechanical planarizing/polishing (CMP), and the like. The lower device surface 306 can comprise various materials, such as silicon dioxide or aluminum oxide. For this example, the device 302 comprises silicon, the bond pads 304 comprise copper, and the lower device surface 306 comprises silicon dioxide prepared and made smooth with a CMP process. The lower device surface 306 can be made smooth enough to permit covalent bonding, which will be discussed further below.

The bond pads 304 can be flush with, project from, or be recessed from the lower device surface 306. In the ongoing example, the bond pads 304 are generally flush with the lower device surface 306 (as shown in FIG. 3). In one embodiment, the bond pads 304 are also made smooth enough to permit covalent bonding.

Figure 4:
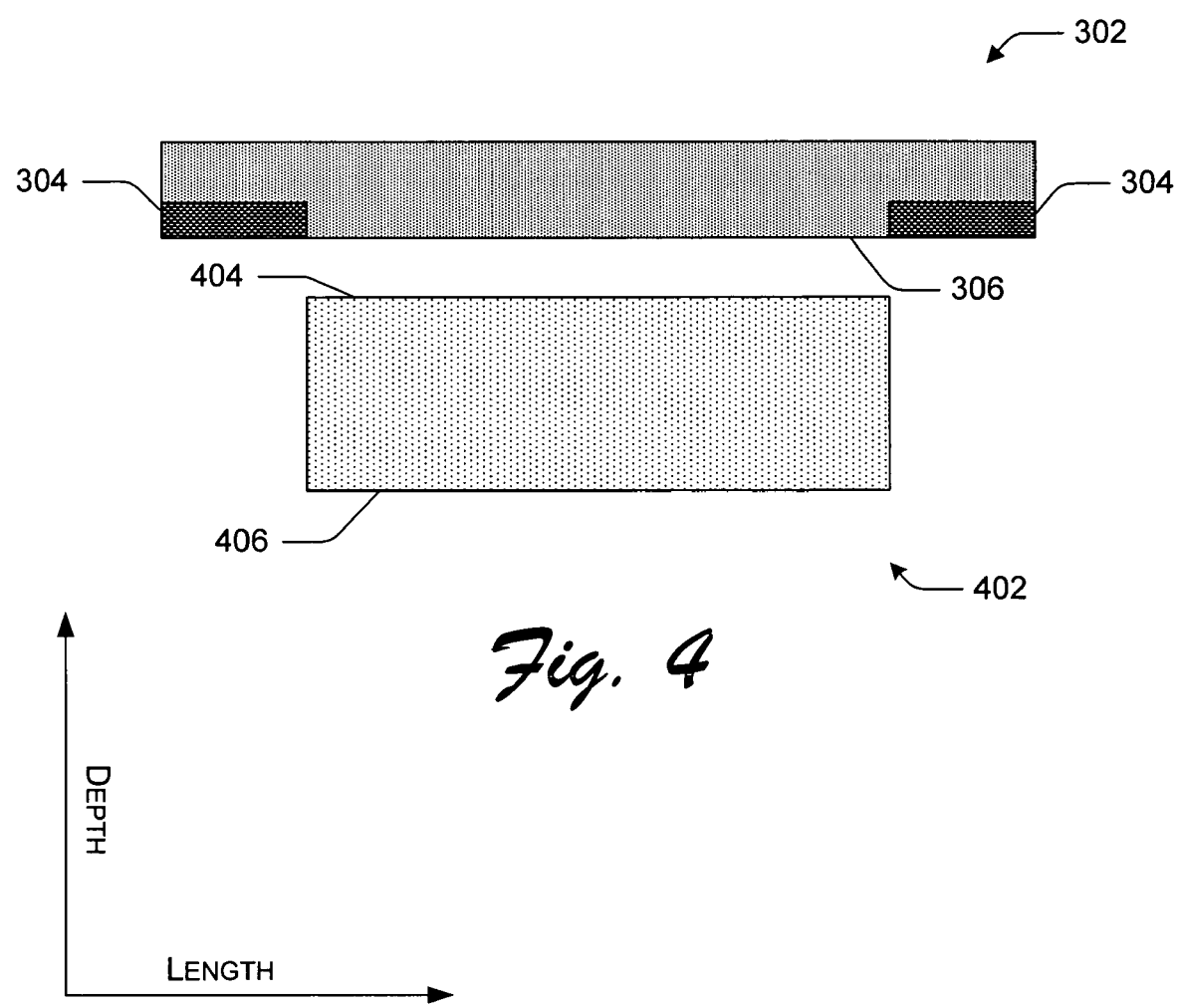
FIG. 4 is a view of the FIG. 3 dense circuit device and a spacer substrate.

Referring to FIG. 4, in the ongoing embodiment a spacer substrate 402 is bonded to the lower device surface 306. The spacer substrate 402 has an upper surface 404 and a lower surface 406, each of which are prepared for bonding by making each smooth enough to covalently bond. The upper surface 404 and the lower surface 406 can be prepared for bonding using a CMP process, such as described above, or with other techniques such as plasma treating. The spacer substrate 402 can comprise various materials, such as aluminum dioxide or silicon. In the ongoing example, the spacer substrate 402 comprises silicon. Also in the ongoing example, the spacer substrate 402 is square and has a length and width about ten millimeters and a depth (thickness) of about 12-75 microns.

Figure 5:
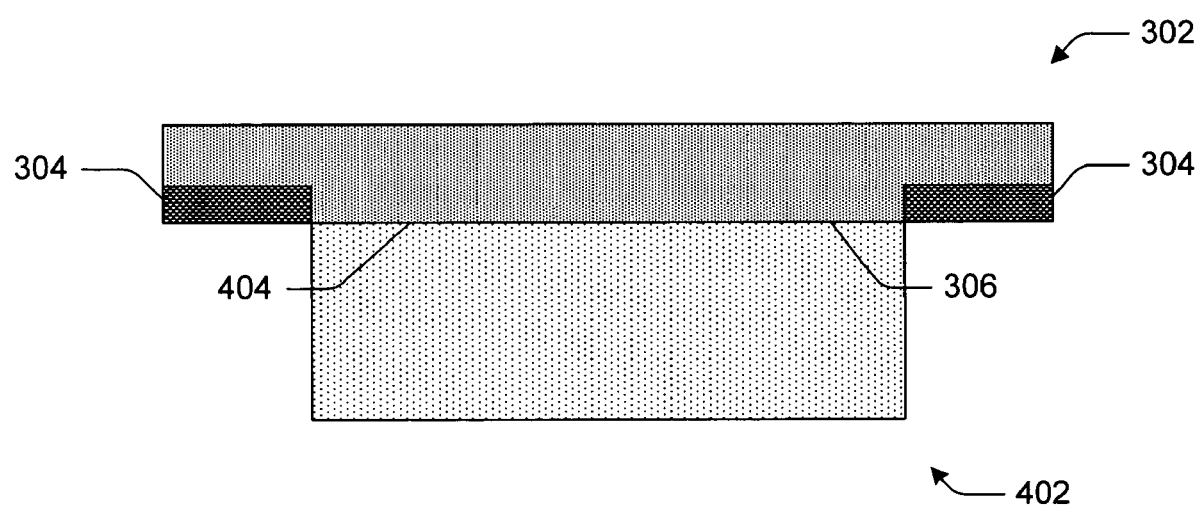
FIG. 5 is a view of the FIGS. 3 and 4 dense circuit device and the FIG. 4 spacer substrate bonded together.
Figure 5:
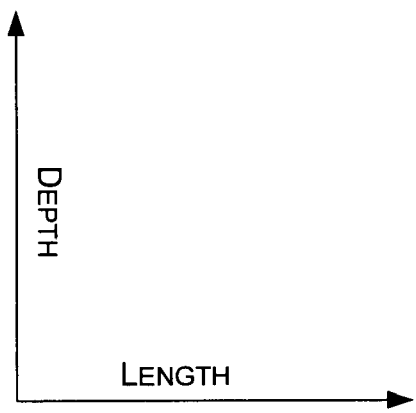

Referring to FIG. 5, in the ongoing embodiment the spacer substrate 402 is bonded with the device 302. Once bonded, the spacer substrate 402 forms a projection from the device 302. The spacer substrate 402 and the device 302 can be bonded with heat bonding, ionic bonding, eutectic bonding, or other suitable techniques. In many cases the spacer substrate's 402 upper surface 404 and the device's 302 lower device surface 306 are not smoothed or otherwise prepared for bonding. In the ongoing example, however, the upper surface 404 of the spacer substrate 402 is smooth enough for covalent bonding and is contacted with the lower device surface 306 of the device 302 (also smooth enough for covalent bonding). At contact, the spacer substrate 402 and the device 302 covalently bond. This bonding can be performed at, for example, room temperature or at elevated temperatures. When contacted at room temperature, nearly 100 percent of possible bond strength can be achieved over time. Over fifty percent of possible bond strength can be achieved almost instantaneously, if the applicable surfaces are smooth enough.

The device 302 can be fabricated such that the spacer substrate 402 is originally part of the device 302. In this implementation, the bond pads 304 are recessed from the spacer substrate's 402 projecting surface. In another implementation, the spacer substrate 402 is part of and forms a projection from a clamping or bottom substrate, discussed below.

The spacer substrate 402 can comprise electrically conductive vias for communication between the device 302 and a bottom substrate, also discussed below.

Figure 6:
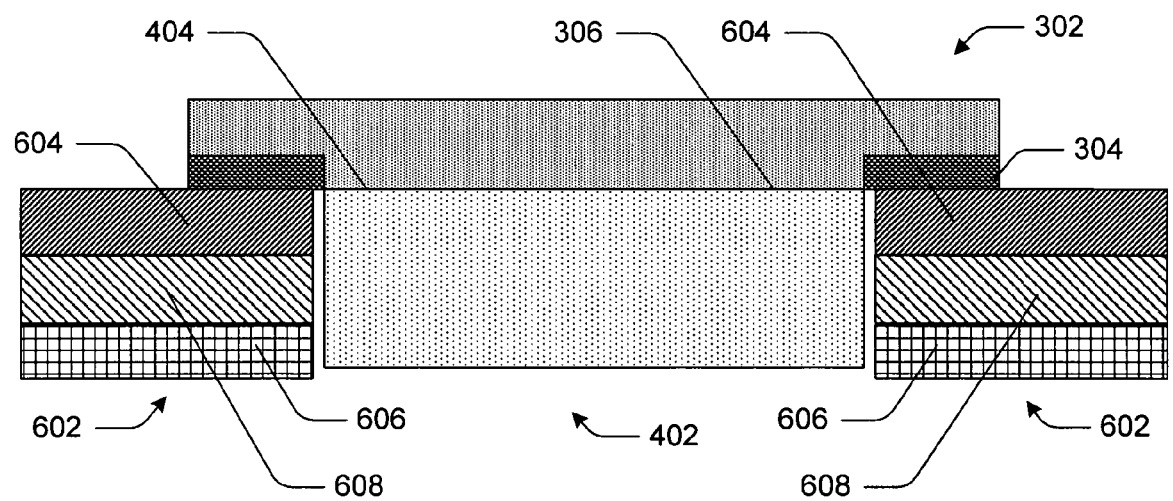
FIG. 6 is a view of the FIG. 5 dense circuit device and spacer substrate and an embodiment of an electrical interconnect.

Referring to FIG. 6, an interconnect 602 is oriented with respect to the device 302 such that a set of wires 604 align with the bond pads 304. Other types of interconnects can be also used, such as grouped and insulated wires, discussed below. The wires 604 can comprise various conductors such as copper, silver, gold, palladium, platinum, and aluminum. For very small wires (such as wires from one to 100 nanometers in length or diameter), highly conductive materials can aid in usability of the device 302. In the ongoing example, the wires 604 comprise copper. In one embodiment, the wires 604 are prepared smooth enough to covalently bond to the bond pads 304 using techniques discussed above.

In the ongoing embodiment, the interconnect 602 includes a compliant layer 606. The compliant layer 606 allows for the interconnect 602 to be compressed more easily than without it. The compliant layer 606 can include various types of compliant materials. It can also include a compliant insulator on a grouped wire, discussed in greater detail below. In the ongoing example, the compliant layer 606 comprises a polyimide.

In another embodiment, the device 302 is constructed to supply compliance. This can be done by choosing compliant materials in its construction or by constructing it to comprise a compliant layer (not shown).

The interconnect 602 can also include an intermediate layer 608 as shown. This intermediate layer 608 in the ongoing example comprises a refractory alloy, such as titanium. This intermediate layer 608 can be used as a seed/adhesion layer for deposition of the copper in the wires 604. Thus, in some embodiments that include an intermediate layer, one characteristic that can be used to select materials of the intermediate layer can include their deposition characteristics with respect to adjacently-deposited materials.

The interconnect 602 and its constituent parts can be of various dimensions. In the ongoing example the wires 604 are about 200 nanometers deep, the intermediate layer 608 about 50 nanometers deep, and the compliant layer 606 about 12-75 microns deep. In the ongoing example, the total depth (thickness) of the interconnect 602 is slightly greater than that of the spacer 402. This difference allows for compression of the interconnect 602.

In one implementation, the interconnect 602 does not include a compliant layer. In this implementation, the spacer substrate 402 can include a compliant layer (not shown), such as between the upper surface 404 and the lower surface 406. This compliant layer can comprise a polyimide substrate.

In another implementation, the interconnect 602 is fabricated to surround the spacer substrate 402 to aid in orienting the wires 604 with the bond pads 304. Thus, the wires 604 of the interconnect 602 correspond to the bond pads 304 of the device 302.

Figure 7:
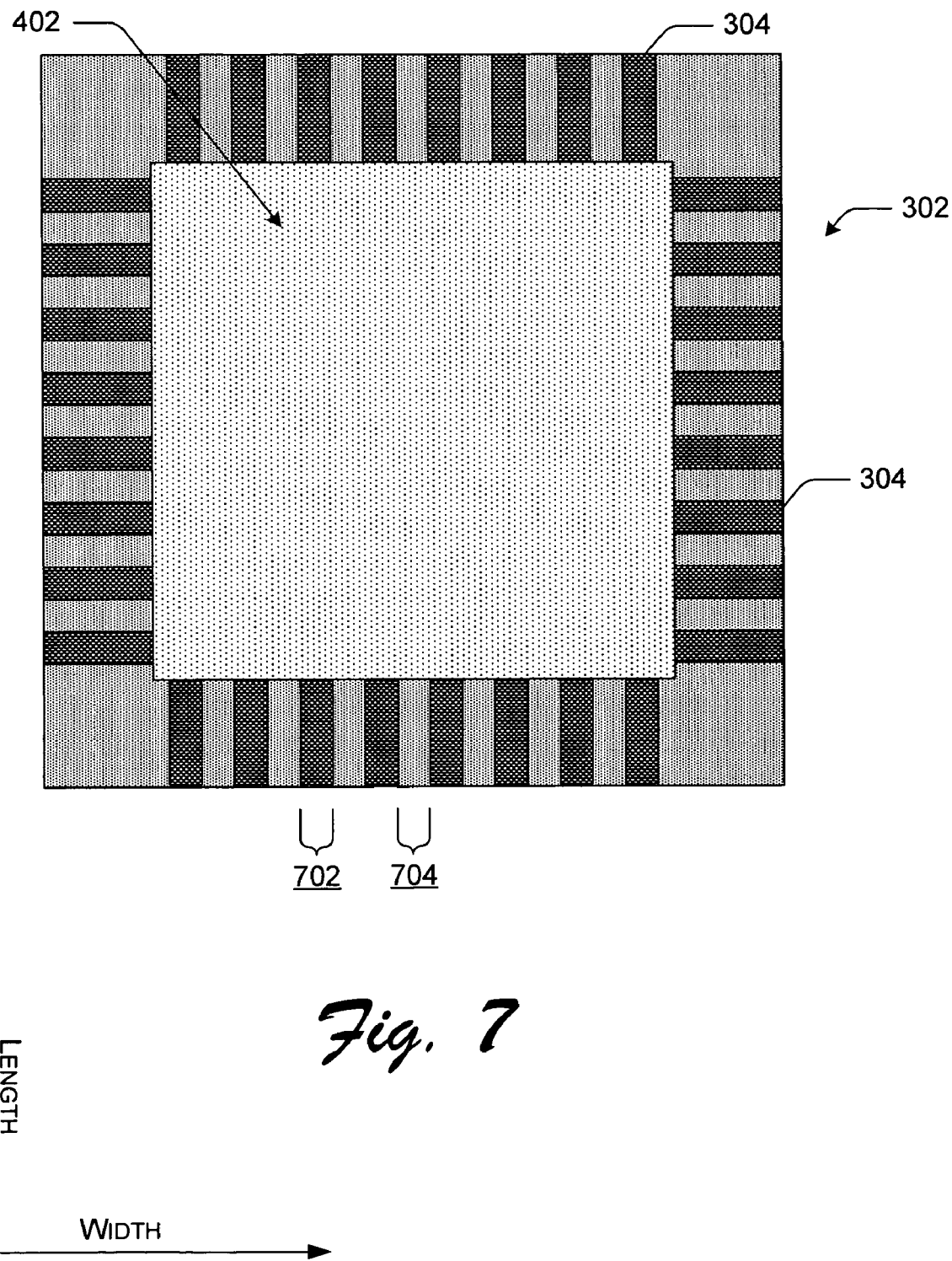
FIG. 7 is a bottom plan view along a length and width dimension of the FIG. 6 dense circuit device and spacer substrate.

Referring to FIG. 7, a bottom plan view is shown of the bond pads 304 and the device 302 with the spacer substrate 402 attached. This bottom plan view of FIG. 7 shows exemplary width and length dimensions of the pads 304. The pads 304 have a pad breadth shown generally with numeral 702. The pads 304 are separated from similarly oriented neighbors by a pad space, shown generally with numeral 704. In the ongoing example the pad breadth 702 and pad space 704 is about 30 nanometers.

Figure 8:
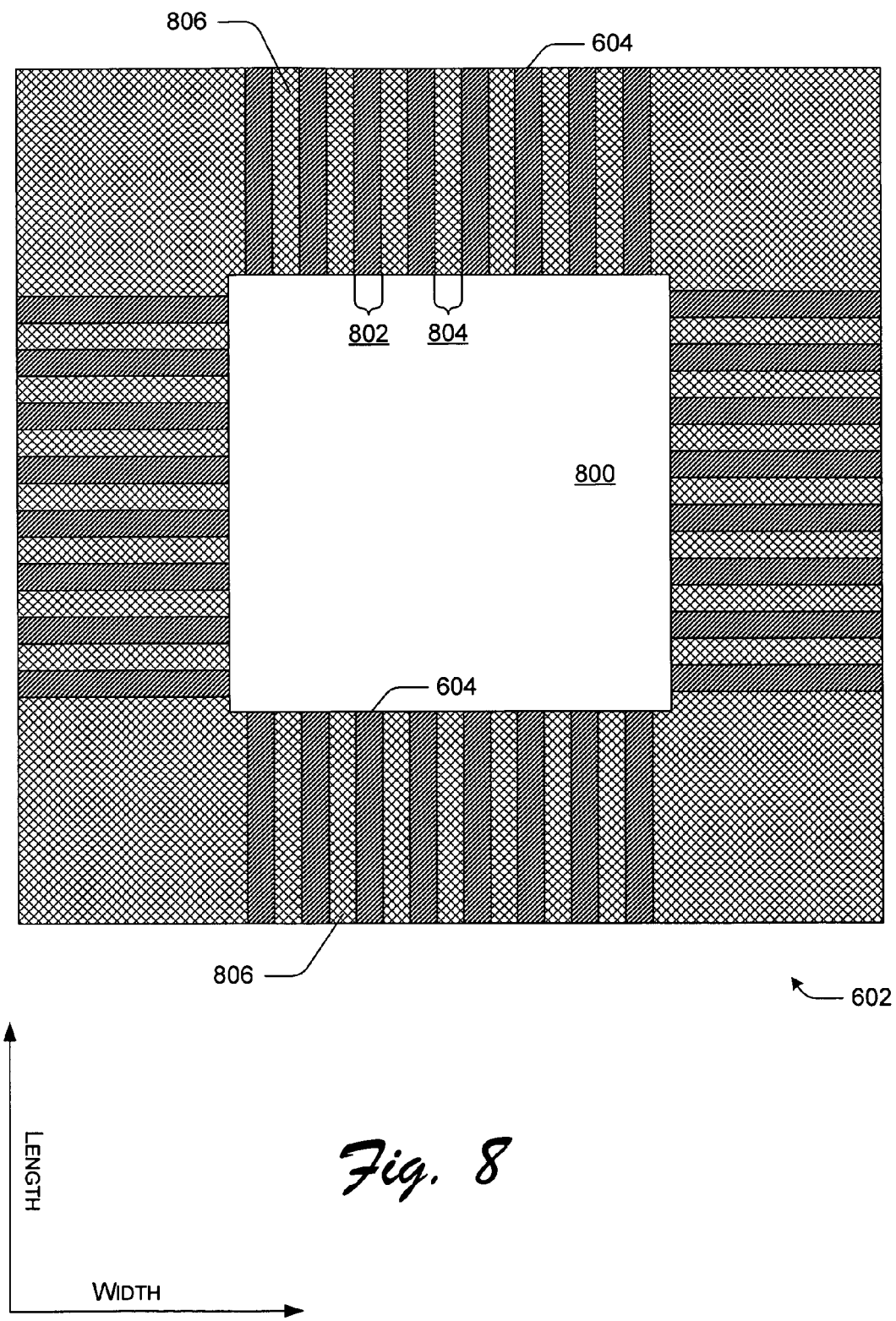
FIG. 8 is a top plan view along a length and width dimension of the FIG. 6 electrical interconnect.

Referring to FIG. 8, a top plan view of the interconnect 602 that is designed to surround the spacer substrate 402 is shown. Here the interconnect 602 has a square hole 800 designed to fit around the spacer substrate 402. This negative of the spacer substrate's 402 projecting shape can be used to aid in orienting the interconnect 602 to the device 302. If the interconnect 602 is to be oriented with multiple dense circuit devices, the interconnect 602 can comprise multiple negatives to aid in orienting, such as with other square holes (not shown). Other shapes of the spacer substrate 402, the device 302, and the interconnect 602 can also be used. This top plan view of FIG. 8 shows width and length dimensions of the wires 604. The wires 604 have a breadth shown generally with the numeral 802. The wires 604 are separated from similarly oriented neighbors by a space, shown generally with numeral 804. The breadth 802 and the space 804, at the point where the wires 604 are to contact the pads 304, corresponds approximately with the pad breadth 702 and the pad space 704. In the ongoing example, the breadth and space 802 and 804 of the wires 604 is about 30 nanometers.

As shown, the wires 604 are separated with an insulator, shown generally with a numeral 806. The insulator can be air or some other suitable insulative material. Use of a material as the insulator 806 can aid in future use of the interconnect 602 by providing additional structural stability for the wires 604.

Figure 9:
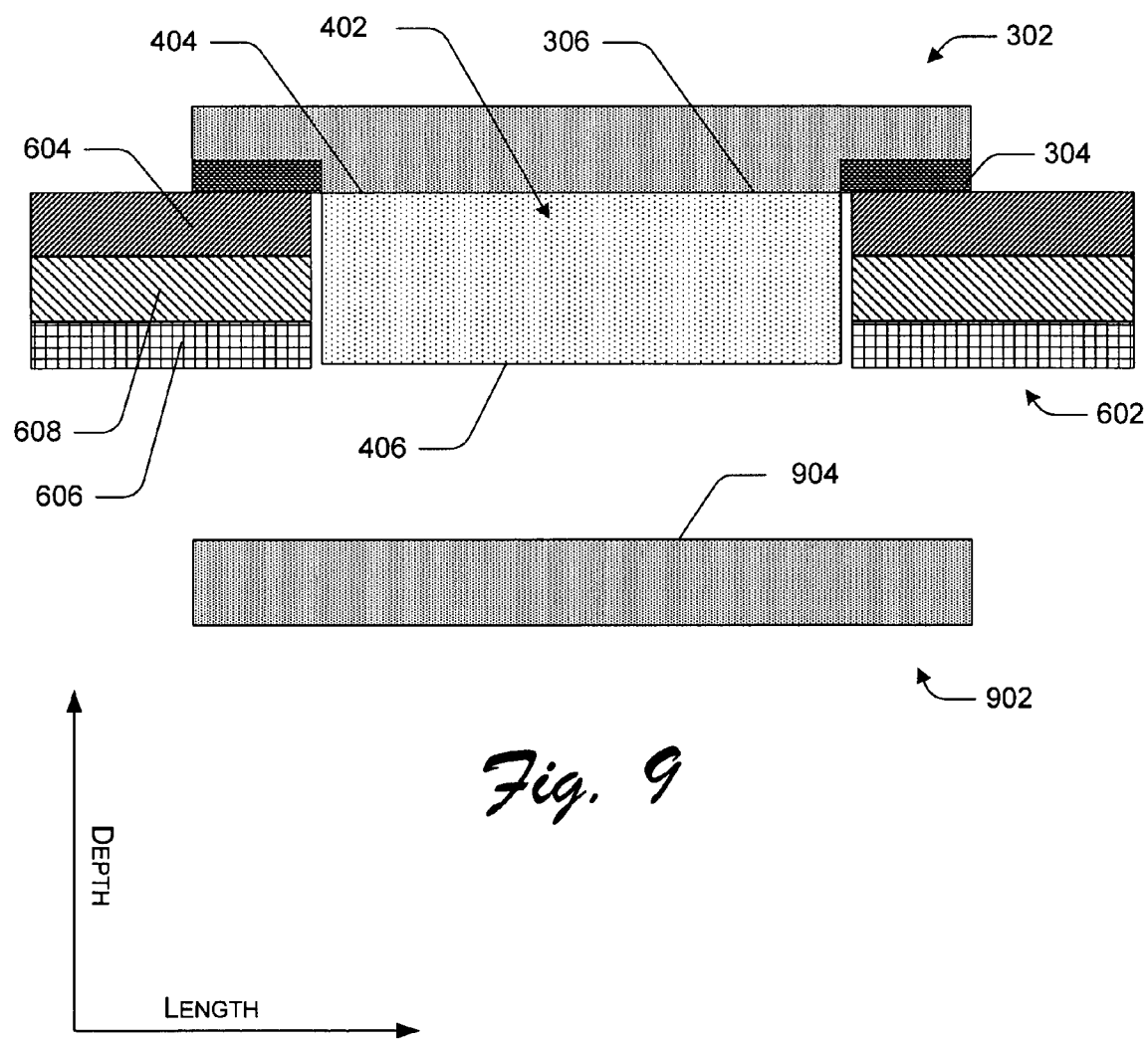
FIG. 9 is a view of the FIG. 6 dense circuit device, spacer substrate, and electrical interconnect and an embodiment of a bottom substrate.

Referring to FIG. 9, in the ongoing embodiment a bottom substrate 902 is prepared for bonding with the spacer substrate 402. As mentioned previously, the lower surface 406 of the spacer substrate 402 is also prepared for bonding in this embodiment. This bottom substrate 902 can be used to clamp an interconnect, such as the interconnect 602, to a dense circuit device, such as the device 302. When used in this manner, the bottom substrate 902 acts as a clamping substrate.

In one embodiment, the spacer substrate 402 and/or the bottom substrate 902 comprises an adhesive. The spacer substrate 402 can comprise a depression in its upper surface 404 and/or its lower surface 406 for the adhesive. The bottom substrate 902 can comprise a depression in its upper surface 904 for the adhesive. In this embodiment, the adhesive is used to bond the spacer substrate 402 to the device 302 and/or the bottom substrate 902.

In another embodiment, the spacer substrate 402 and the device 302 and/or the bottom substrate 902 are configured to permit ionic bonding. In this embodiment, the spacer substrate 402 is bonded to the bottom substrate 902 and/or the device 302 using ionic bonding.

In the ongoing embodiment, the spacer substrate's 402 lower surface 406 and a bottom substrate upper surface 904 are made smooth enough to covalently bond. The bottom substrate upper surface 904 and the lower surface 406 can be processed using a suitable CMP process, such as described above, or with other techniques such as plasma treating. The bottom substrate upper surface 904 can comprise various materials, such as aluminum dioxide or a silicon oxide. In the ongoing example, the bottom substrate upper surface 904 comprises a silicon oxide. Also in the ongoing example, the bottom substrate 902 is about the same length and width as the device 302.

In another embodiment, the interconnect 602 does not include a compliant layer (not shown). In this embodiment, the spacer 402 is very slightly thinner (less deep) than the interconnect 602. This difference in thickness can be adjusted based on how compliant the device 302 and the bottom substrate 902 are to flexing away from the interconnect 602. If, for instance, the device 302 and the bottom substrate 902 are not very compliant, the thickness of the spacer 402 can be only slightly thinner than the interconnect 602. Similarly, if the device and the bottom substrate 902 are compliant, the thickness of the spacer 402 can be more than slightly thinner than the interconnect 602. The thickness of the spacer 402 can also be adjusted based on a compliance to compression of the spacer 402 and the interconnect 602. If the total compliance of these elements is fairly high, the interconnect 602 can be slightly to moderately thicker, such as even microns thicker, than a space between the device 302 and the bottom die 902 (e.g., the spacer 402). If the total compliance is low, the difference can be in a range of angstroms or nanometers.

It is to be appreciated and understood that each of the embodiments described above is set forth as an example, and is not intended to limit the scope or applicability of the claimed subject matter.

Figure 10:
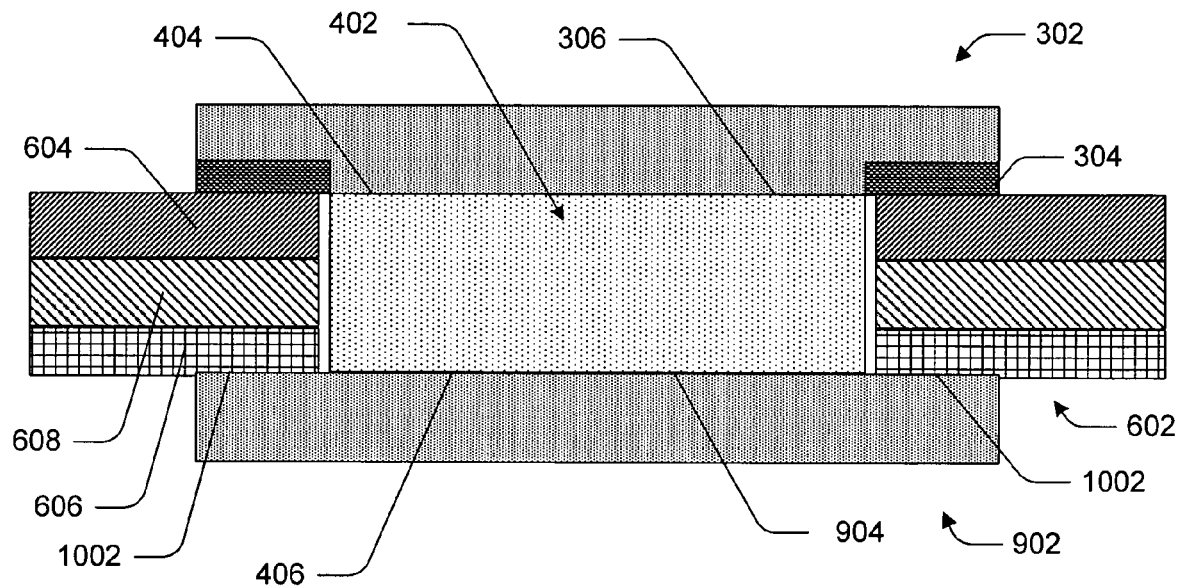
FIG. 10 is a view of the FIG. 9 dense circuit device, spacer substrate, electrical interconnect, and bottom substrate with the interconnect clamped between the dense circuit device and the bottom substrate.
Figure 10:
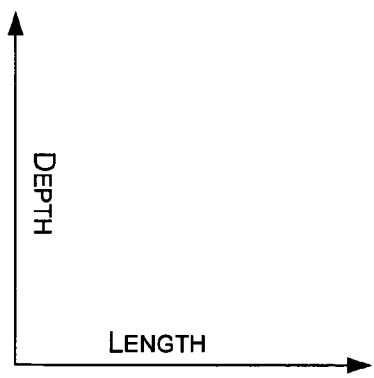

Referring to FIG. 10, the interconnect 602 is bonded to the device 302 at low temperature. Low temperature comprises temperatures below 300° C. In this embodiment, the interconnect 602 is put in electrical communication (i.e., bonded) to the device 302 through physical proximity between the interconnect 602 and the device 302. In this embodiment, however, the interconnect 602 and the device 302 are not necessarily mechanically bonded to each other. Creating the electrical bond between the interconnect 602 and the device 302 can be performed and maintained with pressure. Through this pressure, the wires 604 are mechanically held, though not necessarily mechanically bonded, to the pads 304. This mechanical pressure provides sufficient proximity to enable electrical communication (e.g., an electrical bond) between the wires 604 and the pads 304. This pressure that maintains the electrical bond is created by a mechanical bond, though not necessarily between the interconnect 602 and the device 302. The mechanical bonding can be performed at low temperatures, such as room temperature. Room temperature comprises about 20° C. to 50° C. This low temperature bonding can help alleviate problems associated with an interconnect and dense circuit device having different coefficients of thermal expansion. It also allows for use of high conductivity wires and wide choice in materials chosen for the wires, interconnect, and pads. In one embodiment this pressure is provided by clamping the interconnect 602 to the device 302.

In one implementation of this embodiment, this clamping is performed by the bottom substrate 902 being bonded to the device 302 through covalent bonding. This bonding comprises a covalent bonding of the spacer substrate 402 to either the bottom substrate 902 or the device 302, depending on whether the spacer substrate 402 was first bonded to the device 302 or the bottom substrate 902. In the ongoing example, the spacer substrate 402 is first bonded to the device 302. Then, the bottom substrate upper surface 904 is covalently bonded to the lower surface 406 of the spacer substrate 402. The bottom substrate's upper surface 904 is smooth enough for covalent bonding and is contacted with the lower surface 406, which is also smooth enough for covalent bonding. At contact the spacer substrate 402 and the bottom substrate 902 covalently bond.

This bonding can be performed at low temperatures to reduce problems associated with wire-pad mismatch from different CTEs in the interconnect 602 and the device 302, including room temperature. When contact is made at room temperature, nearly 100 percent of theoretically possible bond strength can be achieved over time. Over fifty percent of theoretical possible bond strength can be achieved almost instantaneously.

In the ongoing embodiment the bottom substrate 902 compresses the interconnect 602. This compression is shown by an indentation in the compliant layer 606, shown generally at a numeral 1002. This compression mechanically clamps the interconnect 602 to the device 302. By so doing, the wires 604 are clamped and thus electrically bonded to the pads 304. The force for this mechanical clamping is provided by the bond of the bottom substrate 902 to the device 302, which compresses the compliant layer 606. The compliant layer 606 provides an opposite reactive force, helping to press the wires 604 to the device 302. The compliant layer 606 can be chosen with a compliance such that the compression used to put the bottom substrate 902 in contact with the device 302 is possible without breaking the device 302 or the bottom substrate 902. The compliant layer 606 can also be chosen with a material incompliant enough to provide sufficient reactive force to hold the wires 604 in electrical communication with the pads 304. The compliant layer 606 can also be constructed such that its reactive force does not dissipate so significantly over time that the electrical communication of the wires 604 to the pads 304 is lost. The compliant layer 606 also aids in the mechanical clamping of the interconnect 602 by allowing for relatively tolerant depth dimensions of the spacer 402 and/or the interconnect 602.

Referring to FIG. 11, a side-section view along a depth and width dimension of the device 302, the interconnect 602, and the bottom substrate 902 of FIG. 10 is shown. Here, the insulator 806 of FIG. 8, which can be part of the interconnect 602 of FIG. 10, is shown.

In another embodiment, a compliant layer is not used. In this embodiment, the reactive force can be provided by the wires 604 and the insulator 806 between the wires 604 (when the insulator 806 is a solid material), the device 302, the spacer substrate 402, and the bottom substrate 902, alone or in combination.

The interconnect systems and methods for bonding described above can, with some modification, also enable electrical connection to multiple dense circuit devices with a single interconnect.

Figure 12:
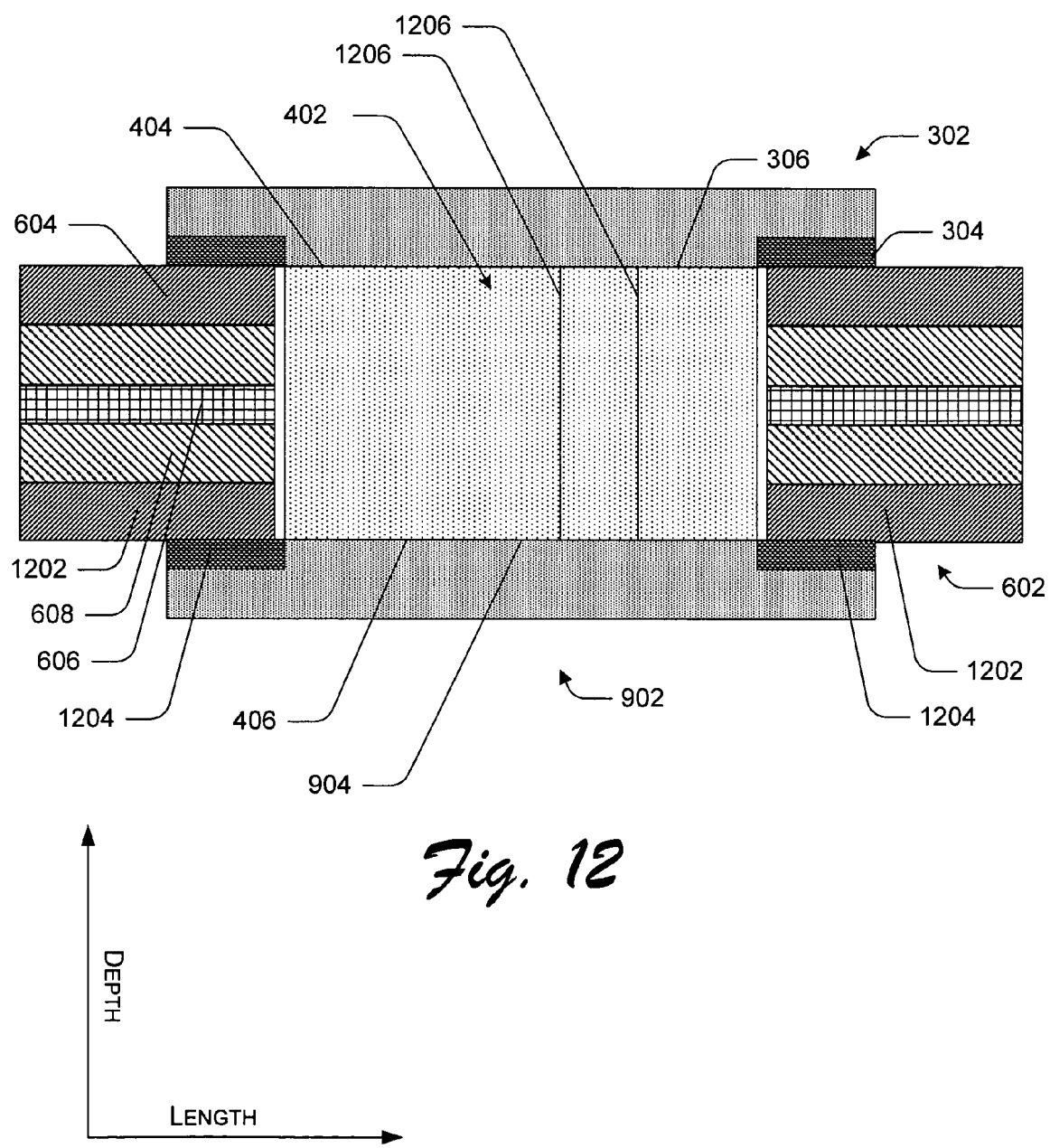
FIG. 12 is a view of the FIG. 5 dense circuit device, and embodiments of a spacer substrate having conductive vias, a double-sided interconnect, and a bottom substrate having circuitry.

Referring to FIG. 12, the interconnect 602 is electrically connected to two devices, the device 302 and an embodiment of the bottom substrate 902 that comprises circuitry. In this embodiment, the interconnect 602 includes a set of bottom wires 1202 and the bottom substrate 902 comprises electrical bond pads 1204. The interconnect 602 in this embodiment also comprises another layer of the intermediate layer 608. When compressed (e.g., clamped), the bottom wires 1202 are electrically bonded to the electrical bond pads 1204. While not shown in FIG. 12, the interconnect 602 can also be electrically connected to other devices, such as by being constructed to allow for additional pairs of the device 302 and the bottom substrate 902 to be connected. These additional pairs can be aligned with the interconnect 602 with aid from additional holes for placing the spacer 402, like the square hole 800 shown in FIG. 8.

Also referring to FIG. 12, the device 302 and the bottom substrate 902 can be placed into electrical communication. This can be performed using electrical vias 1206 in the spacer substrate 402. Thus, in this embodiment, after the bottom substrate 902 is bonded to the spacer 402, the device 302 and the bottom substrate 902 are placed into electrical communication.

The interconnect 602 is one embodiment of an electrical interconnect usable with the described interconnect system and method described above. Other types of interconnects can also be used, such as tab-flex, free wire, and ribbon cable interconnects.

Referring to FIG. 13, a grouped-wire interconnect 1302 is bonded to the device 302. This bonding can be performed at low temperature. It can be performed by clamping the grouped-wire interconnect 1302 to the device 302, thereby creating an electrical bond through maintaining a physical force. The grouped-wire interconnect 1302 can comprise multiple insulated wires simultaneously bonded together.

In one embodiment the grouped-wire interconnect 1302 comprises an insulative layer 1304. The interconnect 1302 is clamped by the bottom substrate 902 by being bonded to the device 302 through low-temperature covalent bonding. This covalent bonding can comprise a covalent bonding of the spacer substrate 402 to either the bottom substrate 902 or the device 302, depending on whether the spacer substrate 402 is first bonded to the device 302 or the bottom substrate 902. This covalent bonding can be performed at room temperature to reduce problems associated with wire-pad mismatch from different CTEs in the grouped-wire interconnect 1302 and the device 302. Thus, this covalent bonding of the interconnect 1302 to the device 302 enables an electrical bond between the wires 604 and the bond pads 304.

In the ongoing embodiment the device 302 and the bottom substrate 902 compress the grouped-wire interconnect 1302 once the bottom substrate 902 is bonded to the device 302. A material allowing compliance can be included between edges of the device 302 and the bottom substrate 902. In one implementation, an embodiment of the compliant layer 606 is used, shown in FIG. 13.

Referring to FIG. 14, a depth and length side-sectional view of the device 302, the grouped-wire interconnect 1302, and the bottom substrate 902, all of FIG. 13, is shown. Here, the compliant layer 606 is also shown. A guide can also be used to confine the wires 604 with the bond pads 304, shown at numeral 1402, while the interconnect 1302 is being clamped.

In this example, the insulative layer 1304 can be used to set a grouped-wire space 1404 between the wires 604. This space 1404 can be about twice the thickness of the insulative layer 1304.

Figure 15:
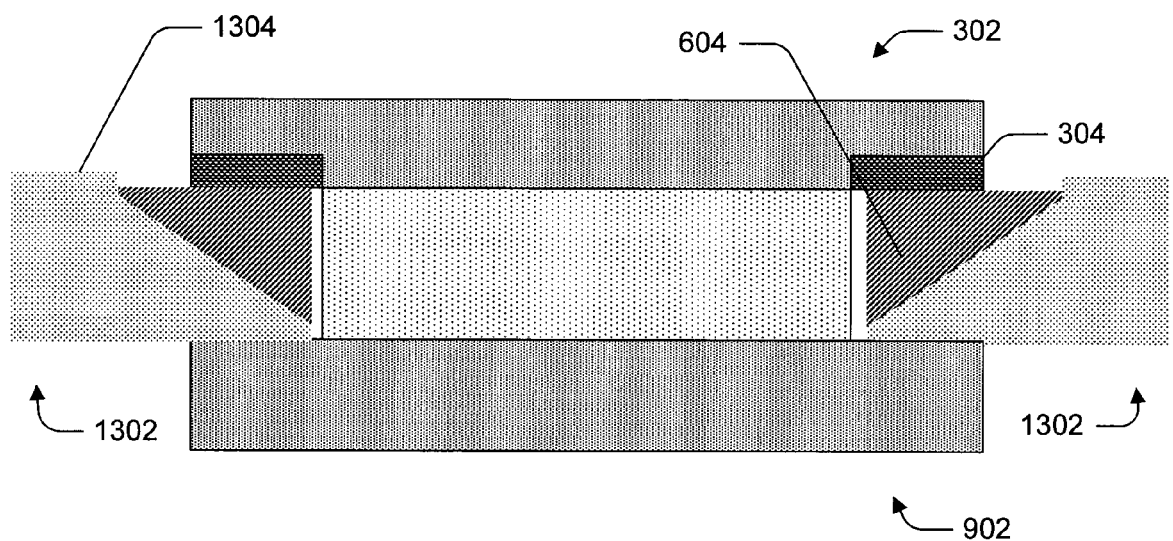
FIG. 15 is a view of the FIG. 13 dense circuit device, spacer substrate, and bottom substrate, and an embodiment of a grouped-wire interconnect.
Figure 15:
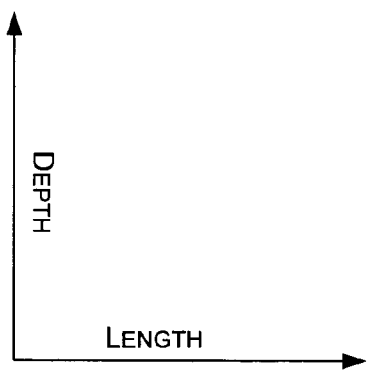

Referring to FIG. 15, a depth and width side-section of the device 302, the grouped-wire interconnect 1302, and the insulative layer 1304 is shown. In this embodiment, the insulative layer 1304 of the wires 604 of the grouped-wire interconnect 1302 acts as a compliant material.

In another embodiment, a compliant layer is not used. In this embodiment, the compliance and reactive force is provided by the wires 604 of the grouped-wire interconnect 1302, the device 302, the spacer substrate 402, and the bottom substrate 902, alone or in combination.

The interconnect 602 and the grouped-wire interconnect 1302 are two embodiments of an electrical interconnect usable with the described interconnect system and method described above, though other embodiments and modifications of these interconnects can also be used.

Figure 16:
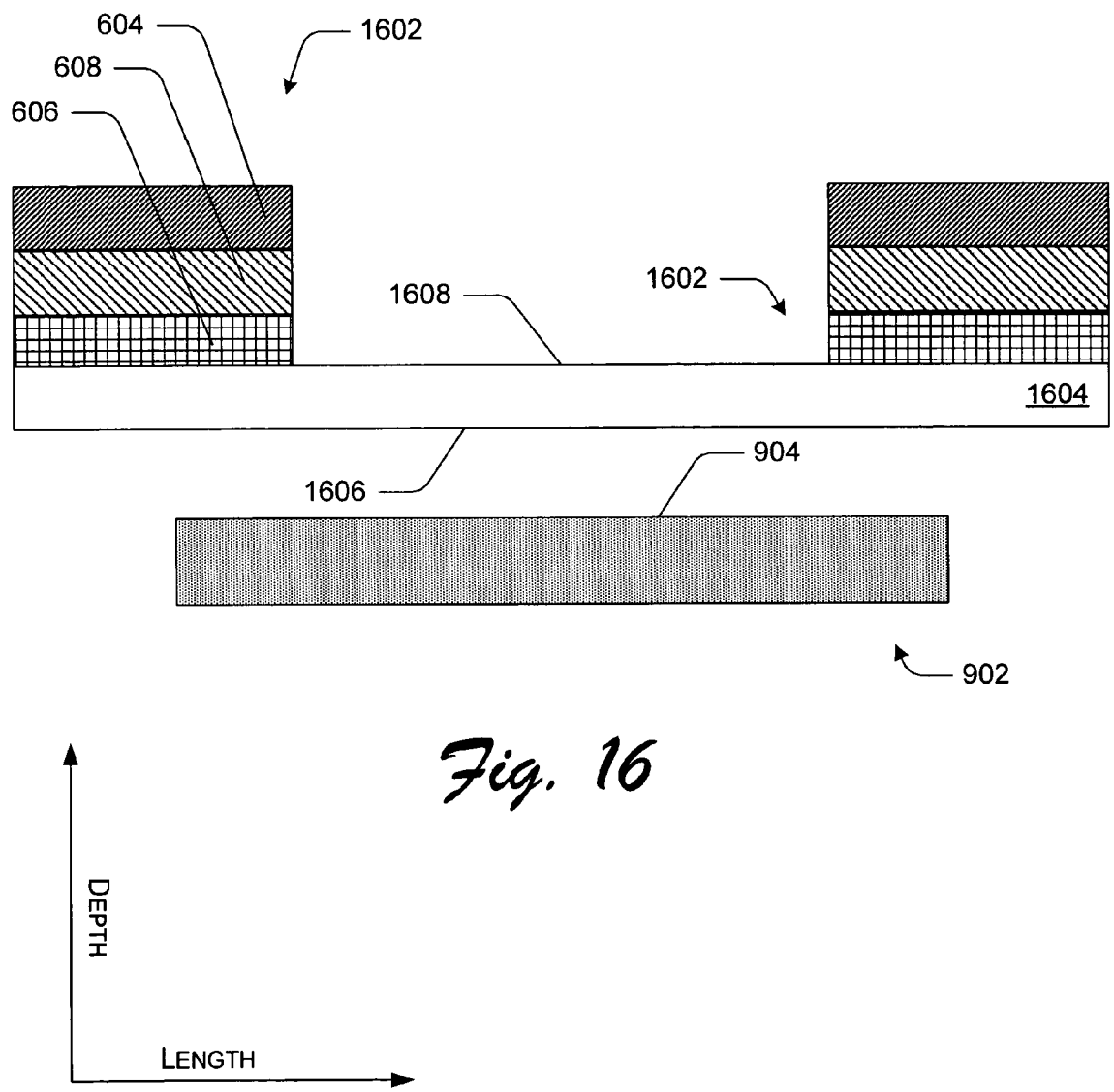
FIG. 16 is a view of the FIG. 9 bottom substrate and an embodiment of a stiffened interconnect.

Referring to FIG. 16, a depth and length side-section view of an embodiment of a stiffened interconnect 1602 and the bottom substrate 902 is shown. The stiffened interconnect 1602 comprises an embodiment of the wires 604, the compliant layer 606, the intermediate layer 608, and a stiffening layer 1604. Especially when an interconnect has thin layers, such as a total thickness (shown along the depth dimension of FIG. 16) of less than one thousand nanometers, the interconnect may be flexible. In this embodiment of FIG. 16, the stiffening layer 1604 acts to stiffen the interconnect 1602. The stiffness provided by the stiffening layer 1604 can aid in orienting the wires 604 with the electrical bond pads 304 (such as those shown in FIG. 3). The stiffening layer 1604 can be of various thicknesses and materials. In the example given in FIG. 16, the stiffening layer 1604 comprises silicon of a few microns thickness.

In this example, a bonding surface 1606 of the stiffening layer 1604 can be prepared for bonding. The interconnect 1602 and the bottom substrate 902 can be bonded in various ways known in the art or can be created as one unit. In the ongoing example the bonding surface 1606 is made smooth enough to covalently bond with the surface 904 of the bottom substrate 902. In the ongoing example the bottom substrate 902 is bonded covalently to the surface 904.

A depression surface 1608 in a depression in the stiffened interconnect 1602 is prepared for bonding. This preparation can include smoothing for covalent bonding.

Figure 17:
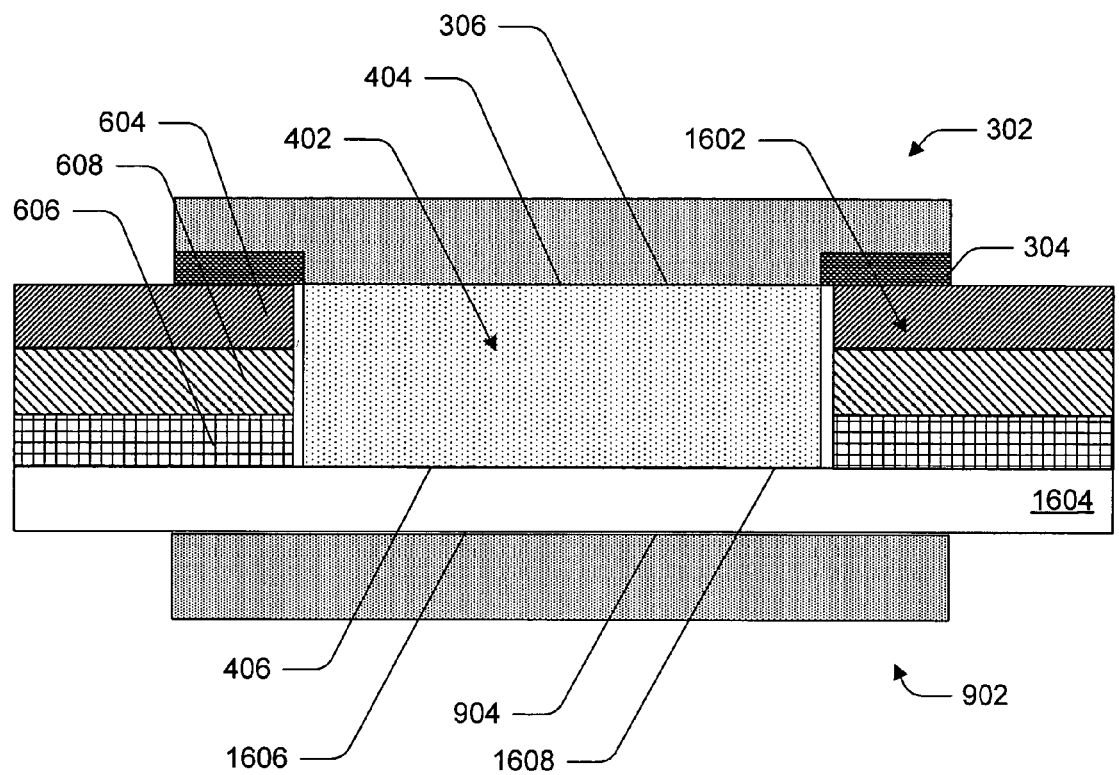
FIG. 17 is a view of the FIG. 16 bottom substrate and stiffened interconnect bonded to the FIG. 4 dense circuit device and spacer substrate.
Figure 17:
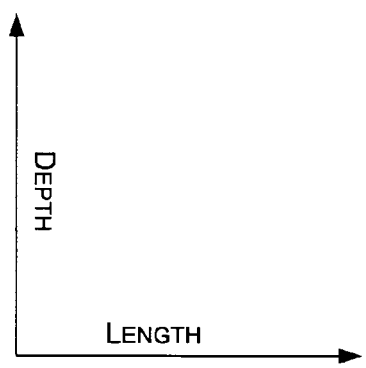

Referring to FIG. 17, a side-section view of the circuit device 302, the spacer substrate 402, the stiffened interconnect 1602, and the bottom substrate 902 is shown. The bottom substrate 902 and the device 302 can be bonded at low temperature, such as room temperature. In one embodiment, the bottom substrate 902 and the device 302 are bonded at room temperature by covalently bonding the depression surface 1608 of the stiffening layer 1604 (which is at a depression in the stiffened interconnect 1602) with a bottom surface 406 of the spacer substrate 402 that has already been bonded or is part of the device 302.

In at least one embodiment, the device 302 is bonded (via clamping) to the stiffened interconnect 1602 after the spacer substrate 402 is bonded to the stiffening layer 1604. In this embodiment, the spacer substrate 402 is then bonded covalently via the upper surface 404 of the spacer substrate 402 and the lower device surface 306 of the device 302. By so doing, the device 302 is electrically bonded to the stiffened interconnect 1602. Following this, the bottom substrate 902 can be bonded to the stiffened interconnect 1602 to provide additional structural strength or compression.

In each of these embodiments, the interconnect 1602 is pressed to the device 302. This pressure provides the mechanical compression to provide electrical communication between the wires 604 to the bond pads 304. The reactive force and compliance in these embodiments is provided in part by the compliant layer 606, also shown in FIG. 17.

Following the bonding of the various interconnects to the devices above, the devices and the interconnect can be cyclically heated to reduce possible strain between the devices and/or the interconnect. This cyclical heating can also aid in or create bonding between wires of the interconnect and pads of the device(s).

Although the invention is described in language specific to structural features and methodological steps, it is to be understood that the invention defined in the appended claims is not necessarily limited to the specific features or steps described. Rather, the specific features and steps disclosed represent exemplary forms of implementing the claimed invention.

What is claimed is:

1. A method comprising:
   orienting an interconnect with respect to a dense circuit device;
   pressing the interconnect to the dense circuit device using a substrate; and
   bonding the substrate to the dense circuit device sufficient to maintain the interconnect against the dense circuit device,
   wherein the act of pressing comprises mechanically clamping the interconnect between the dense circuit device and the substrate.

2. The method of claim 1, wherein the act of orienting the interconnect comprises fitting a negative in the interconnect over a projection on the dense circuit device such that the negative receives and at least partially surrounds the projection.

3. The method of claim 1, wherein the act of orienting comprises orienting wires of the interconnect with electrical bond pads of the dense circuit device.

4. The method of claim 3, wherein the wires and the electrical bond pads overlap and at the overlap have a breadth from tens of nanometers to tens of microns.

5. The method of claim 3, wherein the wires and the electrical bond pads overlap and at the overlap have a space from tens of nanometers to tens of microns.

6. The method of claim 3, wherein the wires and the electrical bond pads overlap and at the overlap have a breadth of less than one micron.

7. The method of claim 3, wherein the wires and the electrical bond pad overlap and at the overlap have a space of less than one micron.

8. The method of claim 3, wherein the wires comprise copper.

9. The method of claim 1, wherein the act of bonding comprises covalently bonding the dense circuit device to the substrate.

10. The method of claim 1, wherein the act of bonding comprises ionic bonding of the dense circuit device to the substrate.

11. The method of claim 1, wherein the act of bonding comprises bonding the dense circuit device to the substrate using an adhesive.

12. The method of claim 1, wherein the act of bonding is performed at low temperature.

13. The method of claim 12, wherein the low temperature comprises room temperature.

14. The method of claim 1, further comprising:
covalently bonding wires of the interconnect with electrical bond pads of the dense circuit device.

15. The method of claim 1, wherein the dense circuit device comprises a length or width of less than or about twenty-five millimeters.

16. The method of claim 1, wherein the dense circuit device and the interconnect have different coefficients of thermal expansion.

17. The method of claim 1, wherein the substrate comprises a second dense circuit device.

18. The method of claim 1, further comprising:
fixing a spacer substrate to one of the dense circuit device or the substrate, and wherein the act of bonding comprises bonding the spacer substrate to an other of the dense circuit device or the substrate to which the spacer substrate is not yet fixed.

19. The method of claim 18, wherein the act of bonding comprises covalent, low-temperature bonding.

20. The method of claim 18, wherein the act of bonding comprises bonding with an adhesive.

21. The method of claim 18, wherein the substrate comprises a second dense circuit device and the spacer substrate comprises conductive vias to allow electrical communication between the dense circuit device and the second dense circuit device.

22. A method comprising:
providing a dense circuit device having a first surface prepared for covalent bonding;
providing a substrate having a second surface prepared for covalent bonding;
orienting an interconnect between the dense circuit device and the substrate; and
mechanically clamping the interconnect between the dense circuit device and the substrate by covalently bonding the first surface to the second surface.

23. The method of claim 22, wherein the act of providing the dense surface device comprises preparing the first surface and the act of providing the substrate comprises preparing the second surface.

24. The method of claim 22, wherein the acts of providing the dense circuit device and providing the substrate comprise planarizing the first surface and the second surface.

25. The method of claim 22, wherein the dense circuit device comprises a projection comprising the first surface and the act of orienting comprises fitting a negative in the interconnect over the projection such that the negative receives and at least partially surrounds the projection.

26. The method of claim 22, wherein the substrate comprises a projection comprising the second surface and the act of orienting comprises fitting a negative in the interconnect over the projection such that the negative receives and at least partially surrounds the projection.

27. The method of claim 22, wherein the act of orienting comprises placing the interconnect between two or more guides.

28. The method of claim 22, wherein the act of orienting comprises orienting wires of the interconnect with electrical bond pads of the dense circuit device.

29. The method of claim 28, wherein the wires and the electrical bond pads overlap and at the overlap have a breadth from about tens of nanometers to tens of microns.

30. The method of claim 28, wherein the wires and the electrical bond pads overlap and at the overlap have a breadth of less than one micron.

31. The method of claim 22, wherein the act of orienting comprises stiffening the interconnect.

32. The method of claim 22, wherein the act of mechanically clamping is performed at low temperature.

33. The method of claim 32, wherein the low temperature comprises room temperature.

34. The method of claim 22, further comprising forming a compliant layer between the interconnect and the substrate.

35. The method of claim 22, wherein the interconnect includes wires and a compliant layer.

36. The method of claim 22, wherein the interconnect includes wires, a compliant layer, and a stiffening layer.

37. The method of claim 22, wherein the interconnect includes grouped wires and an insulative layer.

38. The method of claim 22, wherein the first surface and the second surface comprise a silicon-containing material.

39. The method of claim 22, wherein the substrate comprises a second dense circuit device.

40. The method of claim 39, wherein the substrate and the first dense circuit device are separated by a spacer having conductive vias enabling electrical communication between the second dense circuit device and the first dense circuit device.

41. The method of claim 22 further comprising:
preparing the first surface for covalent bonding and preparing the second surface for covalent bonding.

42. The method of claim 41, wherein the dense circuit device has a projection including the first surface and wherein the interconnect has a hole form by the second surface and wherein orienting the interconnect between the dense circuit device and the substrate includes orienting the projection in the hole.

43. The method of claim 42, wherein the hole is generally a negative of the projection.

44. The method of claim 42, wherein the act of orienting comprises orienting electrical bond pads of the dense circuit device with wires of the interconnect.

45. The method of claim 44, wherein the dense circuit device has a length or width of less than or about twenty-five millimeters and the electrical bond pads or the wires are less than one micron in breadth.

46. The method of claim 44, wherein the dense circuit device has a length or width of less than or about five millimeters and the electrical bond pads or the wires are less than or about ten microns in breadth.

47. The method of claim 44, wherein the act of covalently bonding mechanically bonds wires of the interconnect with electrical bond pads of the dense circuit device.

48. A method comprising:
planarizing a first surface of a dense circuit device;
planarizing a second surface of a spacer substrate;
planarizing a third surface of the spacer substrate;
planarizing a fourth surface of a clamping substrate;
covalently bonding one of the (a) first surface to the second surface or (b) the third surface to the fourth surface;
orienting an interconnect between the dense circuit device and the clamping substrate; and
mechanically clamping the interconnect to the dense circuit device by covalently bonding an other of the (a) first surface to the second surface or (b) the third surface to the fourth surface.

49. The method of claim 48, wherein the act of mechanically clamping is performed at low temperature.

50. The method of claim 48, wherein the dense circuit device comprises a dimension of less than or about twenty-five millimeters.

51. The method of claim 48, wherein the clamping substrate comprises a second dense circuit device.

52. The method of claim 51, wherein the interconnect comprises two sets of wires, the first set contacting the first dense circuit device and the second set contacting he second dense circuit device.

* * * * *

UNITED STATES PATENT AND TRADEMARK OFFICE
CERTIFICATE OF CORRECTION

PATENT NO. : 7,716,823 B2  Page 1 of 1
APPLICATION NO. : 10/822064
DATED : May 18, 2010
INVENTOR(S) : Neal Meyer et al.

It is certified that error appears in the above-identified patent and that said Letters Patent is hereby corrected as shown below:

In column 10, line 44, in Claim 3, delete "claim 1 ," and insert -- claim 1, --, therefor.

In column 10, line 57, in Claim 7, delete "pad" and insert -- pads --, therefor.

In column 14, line 5, in Claim 52, delete "he" and insert -- the --, therefor.

Signed and Sealed this

Twelfth Day of October, 2010

David J. Kappos
*Director of the United States Patent and Trademark Office*